(12) United States Patent
Satou

(10) Patent No.: US 11,581,710 B2
(45) Date of Patent: Feb. 14, 2023

(54) WIRING STRUCTURE

(71) Applicant: FANUC CORPORATION, Minamitsuru-gun (JP)

(72) Inventor: Yoshiki Satou, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 413 days.

(21) Appl. No.: 16/780,536

(22) Filed: Feb. 3, 2020

(65) Prior Publication Data
US 2020/0251888 A1    Aug. 6, 2020

(30) Foreign Application Priority Data

Feb. 6, 2019    (JP) .............................. JP2019-019685

(51) Int. Cl.
*H02B 1/052*    (2006.01)
*H02B 1/20*     (2006.01)
*H01R 9/24*     (2006.01)

(52) U.S. Cl.
CPC .......... *H02B 1/202* (2013.01); *H01R 9/2416* (2013.01); *H02B 1/052* (2013.01)

(58) Field of Classification Search
CPC .................................................. H05K 7/1468
See application file for complete search history.

(56) References Cited

U.S. PATENT DOCUMENTS

| | | | |
|---|---|---|---|
| 5,641,313 A * | 6/1997 | Hohorst | H01R 9/2658 439/716 |
| 5,855,491 A | 1/1999 | Hintner et al. | |
| 8,217,266 B2 * | 7/2012 | Caveney | H02G 3/0418 174/72 A |
| 8,530,744 B2 * | 9/2013 | Caveney | H02G 3/0418 174/72 A |
| 8,755,155 B2 * | 6/2014 | Marmonier | H02H 3/02 361/1 |
| 9,089,067 B2 * | 7/2015 | Gaub | H05K 7/1478 |
| 9,468,124 B2 * | 10/2016 | Kitagawa | H05K 7/1482 |

(Continued)

FOREIGN PATENT DOCUMENTS

| | | |
|---|---|---|
| JP | S63-91976 A | 4/1988 |
| JP | H04-48671 U | 4/1992 |

(Continued)

OTHER PUBLICATIONS

Japanese Office Action, dated Aug. 3, 2021, in Japanese Application No. 2019019685 and English Translation thereof.

*Primary Examiner* — Robert J Hoffberg
(74) *Attorney, Agent, or Firm* — McGinn I.P. Law Group, PLLC.

(57) ABSTRACT

A wiring structure includes: multiple wiring modules configured to be installed on a rail that extends in a predetermined first direction, so as to be adjacent to one another along the rail by being placed on the rail from the side of a second direction orthogonal to the first direction; an IO unit configured to be attached to the plurality of wiring modules from the second direction side to thereby be electrically connected to the multiple wiring modules. In each of the multiple wiring modules, a lead wire extending in a third direction that intersects the first direction and the second direction, from a first face of the wiring module that lies on the third direction side, is connected to the wiring module.

12 Claims, 13 Drawing Sheets

(56) References Cited

U.S. PATENT DOCUMENTS

| | | | | |
|---|---|---|---|---|
| 9,674,972 | B2* | 6/2017 | Kalhoff | H04B 5/0012 |
| 9,727,098 | B2* | 8/2017 | Gillespie | H01T 4/06 |
| 10,483,663 | B2* | 11/2019 | Wrobel | H01R 9/16 |
| 11,128,111 | B2* | 9/2021 | Budde | H04B 3/548 |
| 2011/0268455 | A1* | 11/2011 | Lorenz | H05K 7/1471 |
| | | | | 398/140 |
| 2020/0396857 | A1* | 12/2020 | Chakraborty | H01R 9/245 |

FOREIGN PATENT DOCUMENTS

| | | |
|---|---|---|
| JP | H05-62726 A | 3/1993 |
| JP | 2589695 Y2 | 2/1999 |
| JP | 2859598 B2 | 2/1999 |
| JP | 2000-215931 A | 8/2000 |
| JP | 2001-044662 A | 2/2001 |
| JP | 2001-217016 A | 8/2001 |
| JP | 2008-263144 A | 10/2008 |

* cited by examiner

FIG. 2
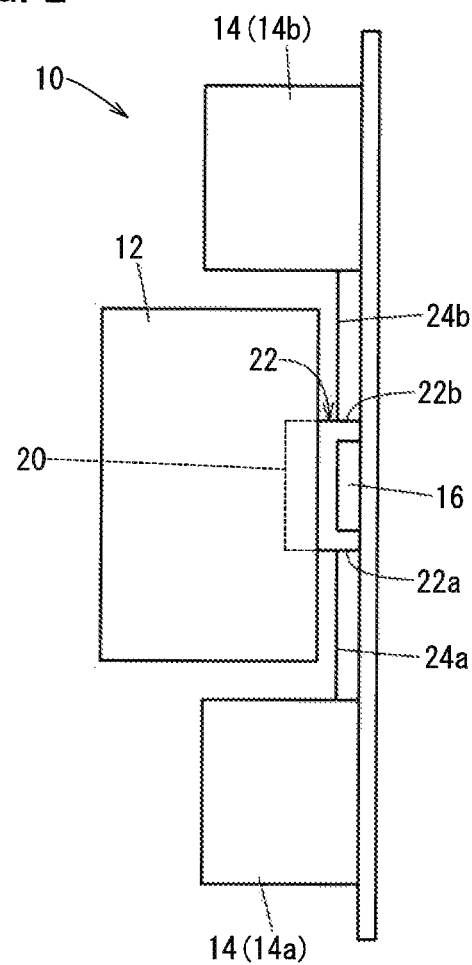
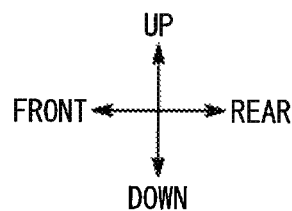

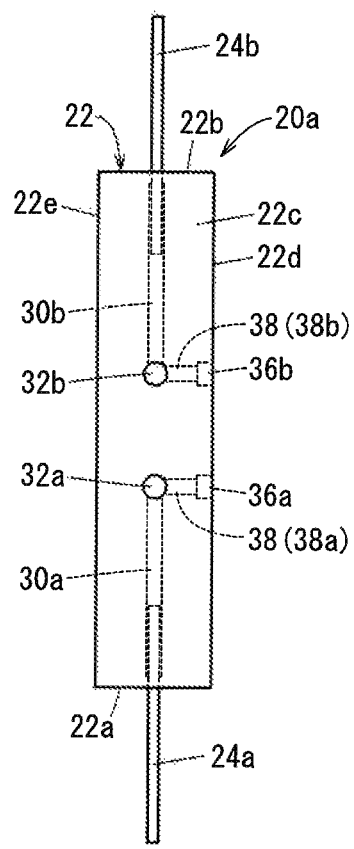
FIG. 4A
FRONT VIEW
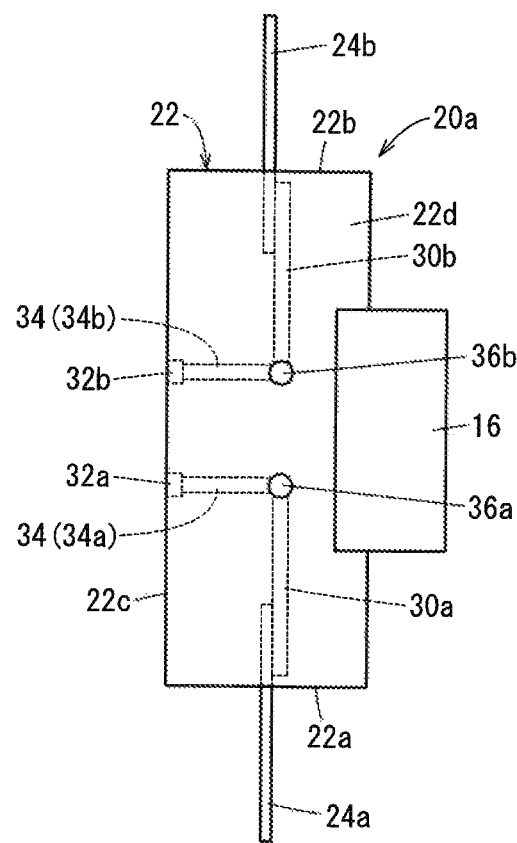
FIG. 4B
RIGHT SIDE VIEW
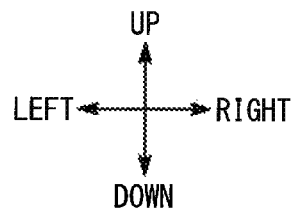
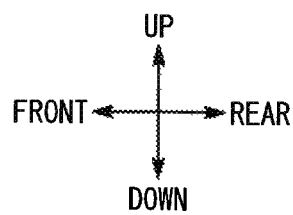

FIG. 5A
FRONT VIEW
FIG. 5B
RIGHT SIDE VIEW
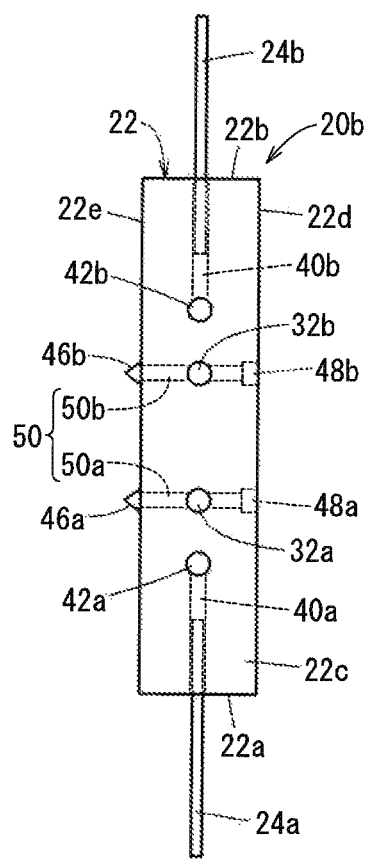
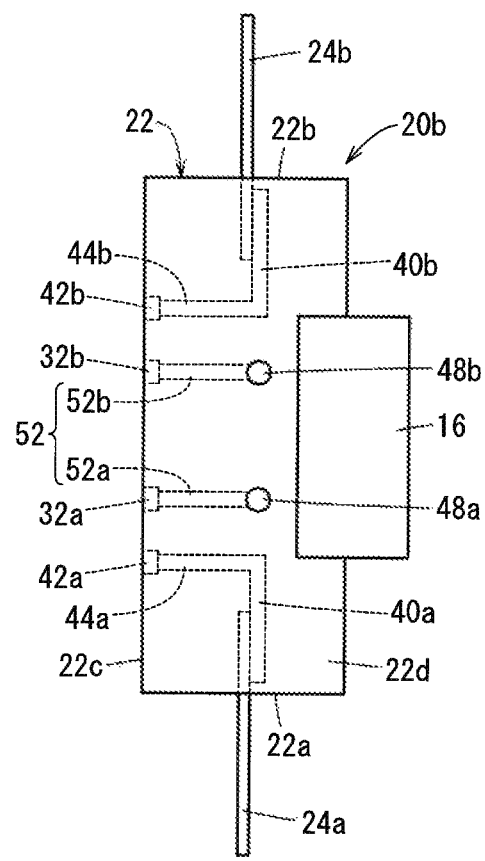
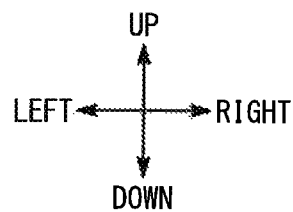
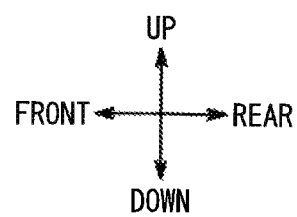

FIG. 7A
FRONT VIEW
FIG. 7B
RIGHT SIDE VIEW
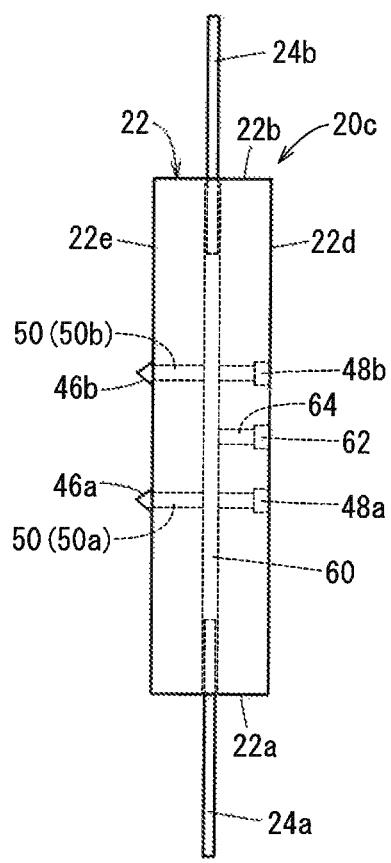
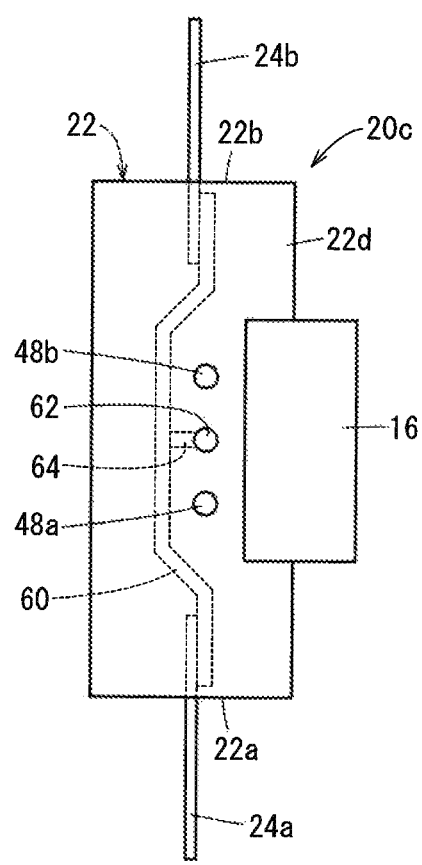
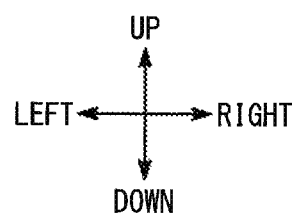
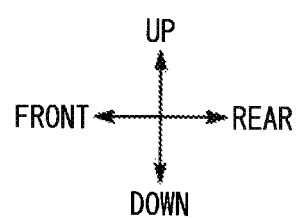

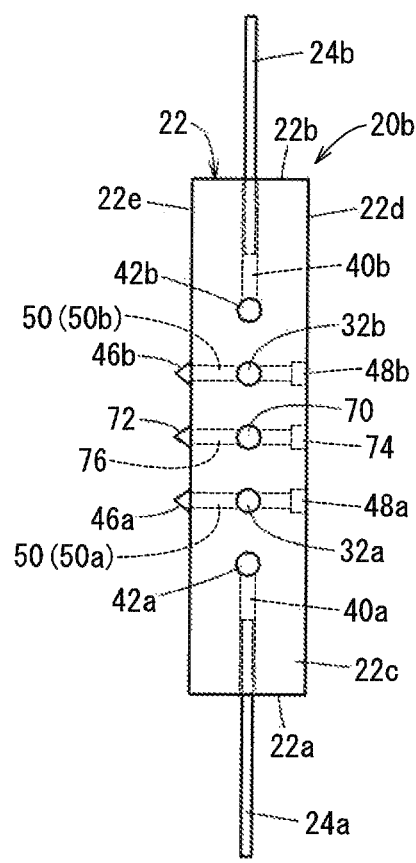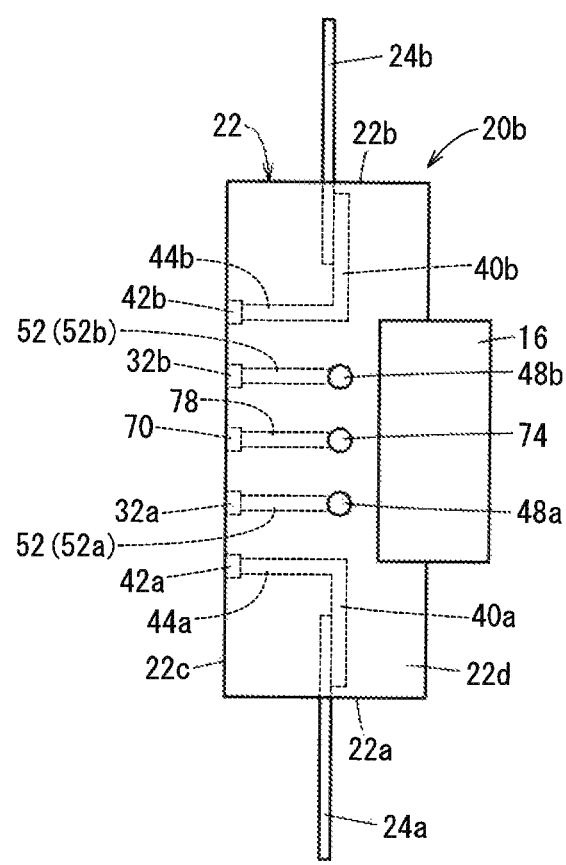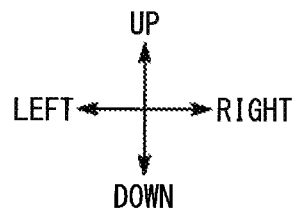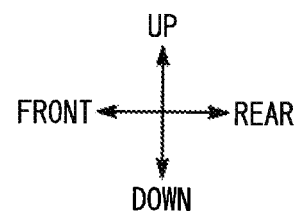

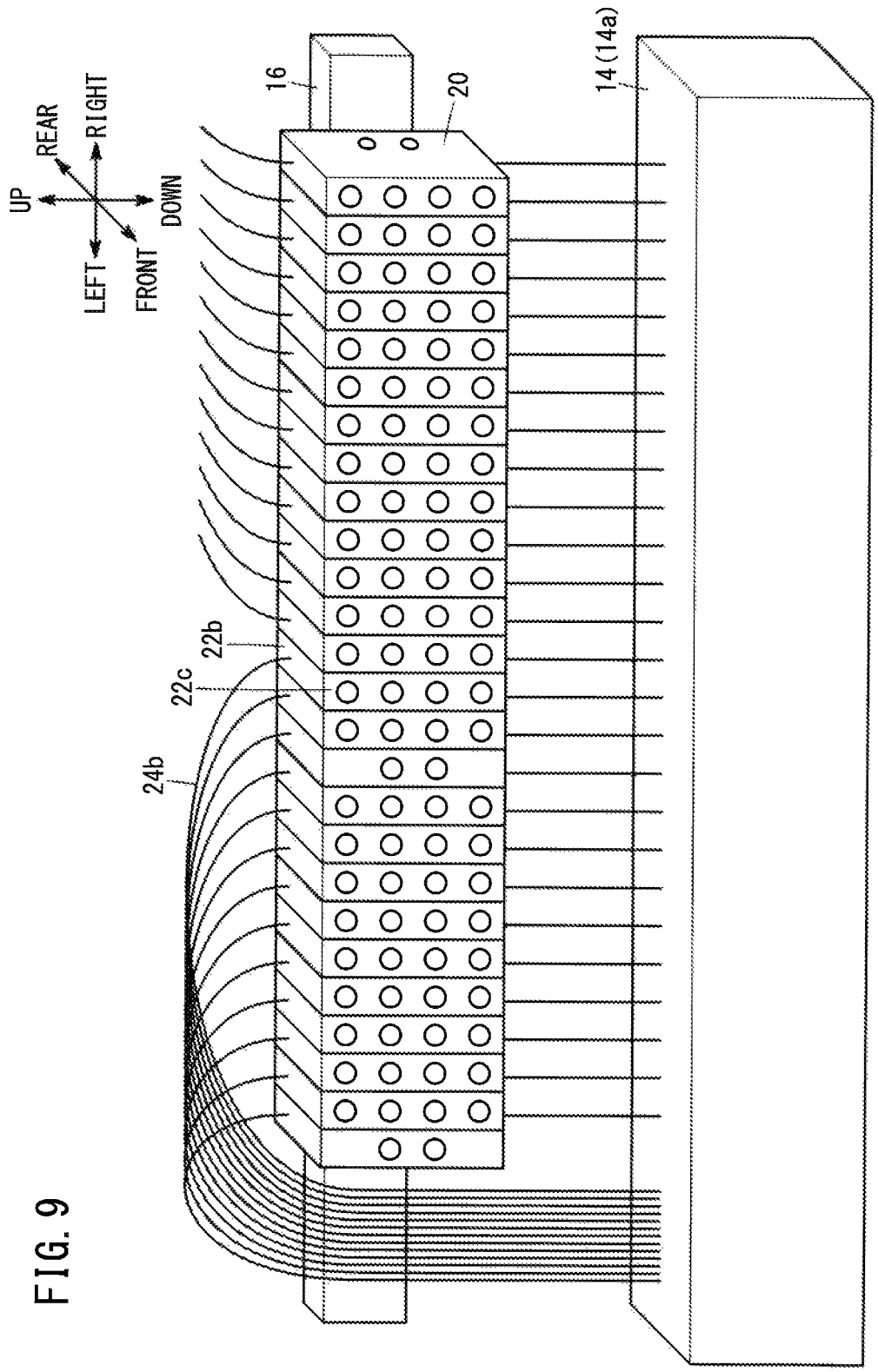

TOP VIEW

FRONT VIEW

RIGHT SIDE VIEW

WIRING STRUCTURE

CROSS-REFERENCE TO RELATED APPLICATION

This application is based upon and claims the benefit of priority from Japanese Patent Application No. 2019-019685 filed on Feb. 6, 2019, the contents of which are incorporated herein by reference.

BACKGROUND OF THE INVENTION

Field of the Invention

The present invention relates to a wiring structure for electrically connecting an input-output unit (IO unit) to a wiring module.

Description of the Related Art

As described in Japanese Laid-Open Patent Publication No. 2008-263144, a DIN rail is generally used as a rail for attaching and fixing an input-output unit (IO unit). The DIN rail is a metal rail and is often used because it is easy to manufacture and it allows for easy attachment and detachment of the unit.

SUMMARY OF THE INVENTION

However, conventionally, wiring is carried out from the IO unit attached to the rail, to the cable duct installed parallel with the rail, in such a manner that wires extend from the front of the IO unit. As a result, the wires cover the front face of the IO unit, posing problems of hindering heat release and hiding the display on the front side of the IO unit. There is also a problem that the wires interfere with maintenance such as replacement of the IO unit.

It is therefore an object of the present invention to provide a wiring structure that improves the front visibility of an IO unit supported by a rail and facilitates maintenance of the IO unit.

A wiring structure according to a first aspect of the present invention includes: a plurality of wiring modules configured to be installed on a rail that extends in a predetermined first direction, so as to be adjacent to one another along the rail, by being placed on the rail from the side of a second direction orthogonal to the first direction; and an input-output unit (IO unit) configured to be attached to the plurality of wiring modules from the side of the second direction to thereby be electrically connected to the plurality of wiring modules, wherein each of the plurality of wiring modules includes, connected thereto, a lead wire extending in a third direction that intersects the first direction and the second direction, from a first face of the wiring module that lies on a side of the third direction.

According to the present invention, it is possible to enhance the visibility of the front side of the IO unit supported by the rail and assure easy maintenance of the IO unit.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 2 is a right side view of the state in which the IO unit is connected in the wiring structure according to the embodiment;

FIG. 4A is a front view of a power supply wiring module, and FIG. 4B is a right side view thereof;

FIG. 5A is a front view of a signal wiring module, and FIG. 5B is a right side view thereof;

FIG. 7A is a front view of a common wiring module according to a modified example 1, and FIG. 7B is a right side view thereof;

FIG. 8A is a front view of a signal wiring module according to the modified example 1, and FIG. 8B is a right side view thereof;

FIG. 9 is a perspective view showing a state in which a cable duct is provided only on the lower side of a rail;

DESCRIPTION OF THE PREFERRED EMBODIMENTS

The wiring structure according to the present invention will be detailed below by describing a preferred embodiment with reference to the accompanying drawings

Embodiment

Figure 1:
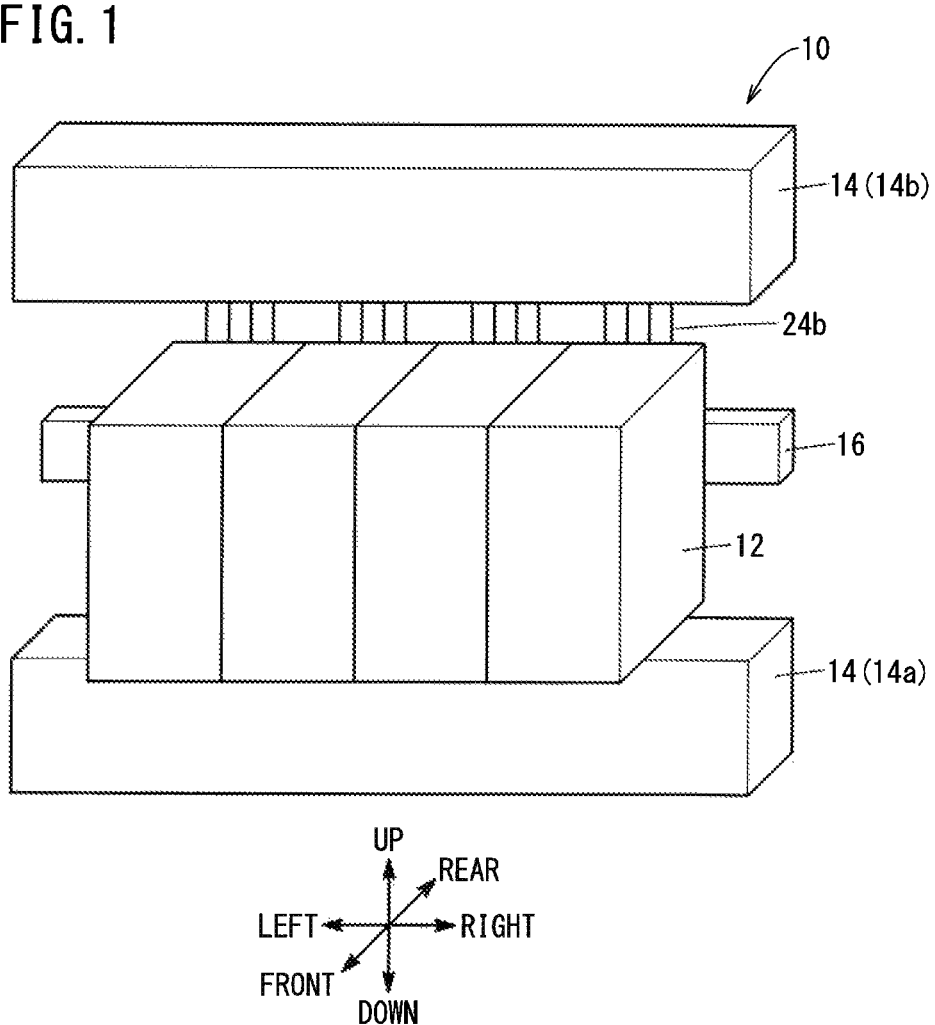
FIG. 1 is a perspective view showing a state in which an IO unit is connected in a wiring structure according to an embodiment.
Figure 3:
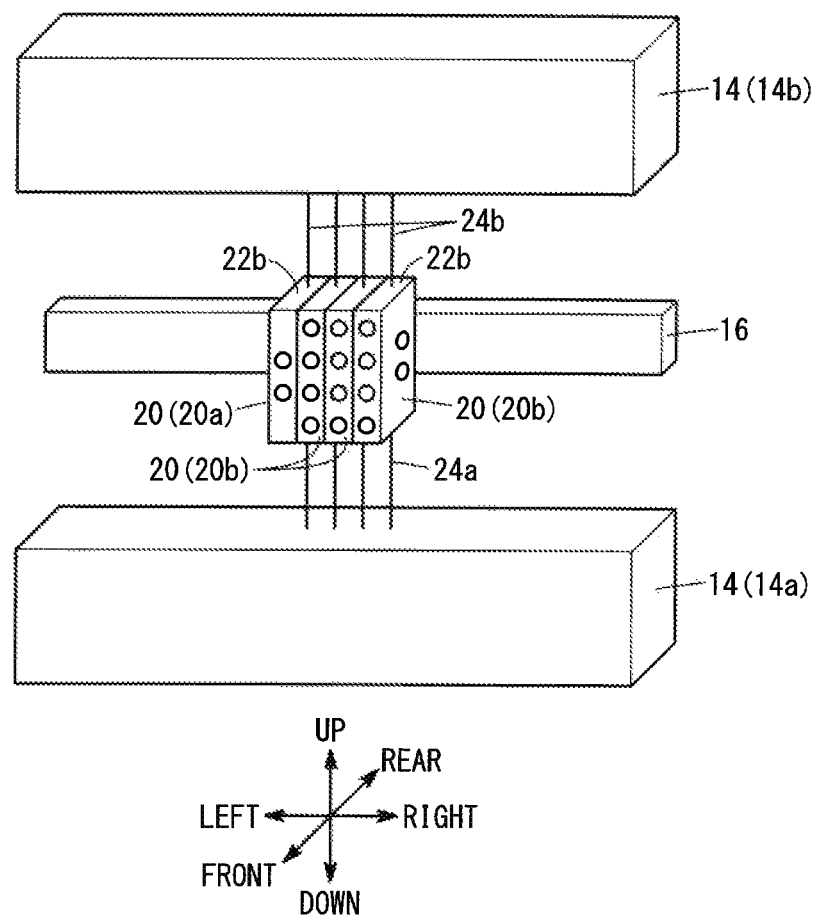
FIG. 3 is a perspective view showing a plurality of wiring modules provided in a wiring structure.

FIG. 1 is a perspective view showing a state in which an input-output unit (IO unit) 12 is connected in a wiring structure 10 according to an embodiment. As to the directions, up, down, left, right, front and rear are defined as shown in FIG. 1. The up-down direction, the left-right direction, and the front-rear direction are orthogonal to each other. FIG. 2 is a right side view of the state in which the IO unit 12 is connected in the wiring structure 10 according to the embodiment. The wiring structure 10 includes a plurality of wiring modules 20 and IO units 12 installed on a rail 16. A specific example of the rail 16 is a DIN rail. The IO unit 12 is a unit that performs input/output operations with respect to the outside. FIG. 3 is a perspective view showing a plurality of wiring modules 20 provided in the wiring structure 10. FIG. 3 shows a state in which no IO units 12 are attached to the wiring modules 20.

As shown in FIGS. 1 to 3, the rail 16 extends in a predetermined first direction (rightwards or leftwards). A cable duct 14a is provided on the lower side of the rail 16, and another cable duct 14b is provided on the upper side of the rail 16. The cable ducts 14 (14a, 14b) extend along the first direction. As shown in FIG. 3, the multiple wiring modules 20 are set on the rail 16 from the front side (second direction side) of the rail 16 so as to be adjacent to each other along the rail 16. Each IO unit 12 is attached to the multiple wiring modules 20 from the front side of the wiring module 20 to thereby be electrically connected to the multiple wiring modules 20.

Furthermore, each of the multiple wiring modules 20 has a lead wire 24a connected thereto, extending downward (in a third direction) from a lower face 22a (first face) of its housing 22, and a lead wire 24b connected thereto, extending upward (in the direction opposite to the third direction) from an upper face 22b (second face) of the housing 22. In the present embodiment, the third direction is described as being orthogonal to the first direction and the second direction. However, the third direction is not necessarily orthogonal to the first direction and the second direction as long as it intersects these directions. In addition, the wiring module 20 does not necessarily have both the lead wire 24a and the lead wire 24b connected thereto, and only one of them may be connected.

The lead wire 24a from the lower face 22a extends at least to the cable duct 14a, whereas the lead wire 24b from the upper face 22b extends at least to the cable duct 14b. One of the multiple wiring modules 20 in FIG. 3 is a power supply wiring module 20a for supplying a power supply voltage to the IO unit 12. Further, the remaining three of the multiple wiring modules 20 in FIG. 3 are signal wiring modules 20b for transmitting signals to be input to and output from the IO unit 12.

FIGS. 4A and 4B are diagrams showing the configuration of the power supply wiring module 20a. FIG. 4A is a front view of the power supply wiring module 20a viewed from the front side, and FIG. 4B is a right side view of the power supply wiring module 20a viewed from the right side.

A power supply voltage is supplied to the power supply wiring module 20a from the lead wires 24a and 24b which are power supply lines connected to the power supply wiring module 20a. The lead wire 24a is inserted into the housing 22 of the power supply wiring module 20a from the lower face 22a of the housing 22 of the power supply wiring module 20a, and is electrically connected to the interconnection 30a in the housing 22 of the power supply wiring module 20a. The method of electrically connecting the lead wire 24a and the interconnection 30a is not limited. The lead wire 24a inserted in the housing 22 of the power supply wiring module 20a may be mechanically put into contact with the interconnection 30a by a push pin, using a spring, or by fixture with a screw. The lead wire 24b is inserted into the housing 22 of the power supply wiring module 20a from the upper face 22b of the housing 22 of the power supply wiring module 20a, and is electrically connected to the interconnection 30b in the housing 22 of the power supply wiring module 20a. The method for electrically connecting the lead wire 24b and the interconnection 30b is not limited similarly to the above.

The power supply wiring module 20a has, formed in a front face 22c thereof, power terminals 32a and 32b that are electrically connected to the IO unit 12. A first supply line 34a for connecting the power terminal 32a and the interconnection 30a and a second supply line 34b for connecting the power terminal 32b and the interconnection 30b, are provided in the housing 22 of the power supply wiring module 20a. The supply line, designated at 34, of the first supply line 34a and the second supply line 34b supplies the power supply voltage supplied from the lead wires 24a and 24b, to the IO unit 12 via the power terminals 32a and 32b.

Here, the power terminals 32a and 32b and the supply line 34 do not necessarily need to be provided in the power supply wiring module 20a.

The right side face 22d of the power supply wiring module 20a is provided with power terminals 36a and 36b that are electrically connected to the power terminals of the adjacent wiring module 20 (not shown in FIGS. 4A and 4B). A first power line 38a for connecting the power terminal 36a with the interconnection 30a and a second power line 38b for connecting the power terminal 36b with the interconnection 30b, are provided in the housing 22 of the power supply wiring module 20a. The power line, designated at 38, of the first power line 38a and the second power line 38b supplies the power supply voltage supplied from the lead wires 24a and 24b, to the adjacent wiring module 20 via the power terminals 36a and 36b. Here, the power supply wiring module 20a may be configured such that the power terminals 36a and 36b are provided on the left side face 22e.

FIGS. 5A and 5B are diagrams showing the configuration of the signal wiring module 20b. FIG. 5A is a front view of the signal wiring module 20b, as viewed from the front side, and FIG. 5B is a right side view of the signal wiring module 20b, as viewed from the right side.

The lead wires 24a and 24b connected to the signal wiring module 20b are signal wires, and transmit signals input to and output from the IO unit 12. The lead wire 24a is inserted into the housing 22 of the signal wiring module 20b from the lower face 22a of the signal wiring module 20b, and is electrically connected to the interconnection 40a in the housing 22 of the signal wiring module 20b. The lead wire 24b is inserted into the housing 22 of the signal wiring module 20b from the upper face 22b of the signal wiring module 20b, and is electrically connected to the interconnection 40b in the housing 22 of the signal wiring module 20b. As in the case of the method of electrically connecting the lead wire 24a and the interconnection 30a, the method of electrically connecting the lead wire 24a and the interconnection 40a and the method of electrically connecting the lead wire 24b and the interconnection 40b are not limited.

On the front face 22c of the signal wiring module 20b, in addition to the power terminals 32a and 32b that are electrically connected to the IO unit 12, signal terminals 42a and 42b that are electrically connected to the IO unit 12 are further provided. Further, an input/output line (input and output line) 44a connecting the signal terminal 42a and the interconnection 40a and an input/output line (input and output line) 44b connecting the signal terminal 42b and the interconnection 40b are provided in the housing 22 of the signal wiring module 20b. Therefore, the input/output line 44a electrically connects the lead wire 24a and the IO unit 12, and the input/output line 44b electrically connects the lead wire 24b and the IO unit 12.

The signal wiring module 20b has, on the left side face 22e, power terminals 46a and 46b that are electrically connected to the power terminals 36a and 36b or the power terminals 48a and 48b of one of the adjacent wiring modules 20 that is arranged on the left side (not shown in FIGS. 5A and 5B). The right side face 22d of the signal wiring module 20b is provided with power terminals 48a and 48b that are electrically connected to the power terminals 46a and 46b of the other adjacent wiring module 20 (not shown in FIGS. 5A and 5B), which is arranged on the right side.

Further, a first power line 50a which connects the power terminal 46a and the power terminal 48a, and a second power line 50b that connects the power terminal 46b and the power terminal 48b are provided in the housing 22 of the signal wiring module 20b. Thereby, the power line, designated at 50, of the first power line 50a and the second power line 50b, delivers power supply voltage from the adjacent wiring module 20 on one side, to the adjacent wiring module 20 on the other side.

Furthermore, a first supply line 52a is branched from the middle of the first power line 50a, and connected to the power terminal 32a, whereas a second supply line 52b is branched from the middle of the second power line 50b, and connected to the power terminal 32b. Thereby, the supply line, designated at 52, of the first supply line 52a and the second supply line 52b, delivers power supply voltage from one adjacent wiring module 20, to the IO unit 12 via the power terminals 32a and 32b.

Figure 6:
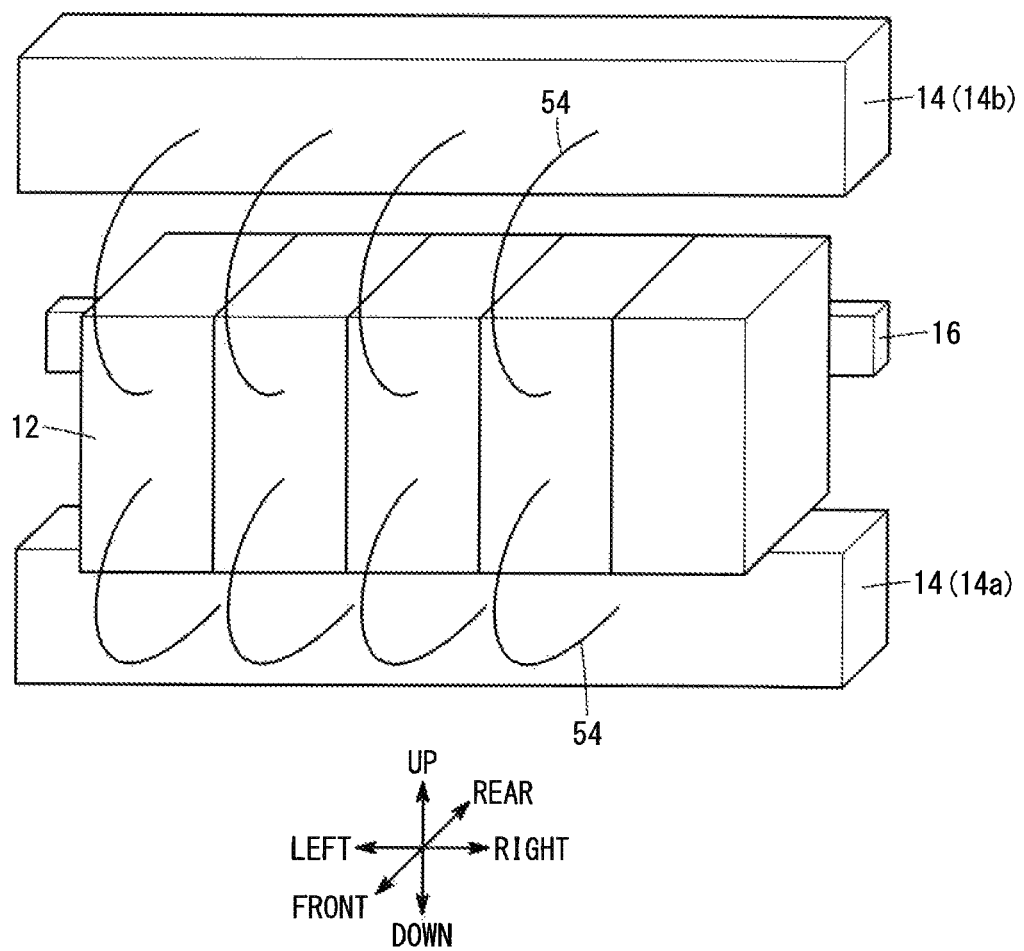
FIG. 6 is a diagram for explaining a conventional wiring structure from IO units to cable ducts.

FIG. 6 is a diagram for explaining a conventional wiring structure from IO units 12 to cable ducts 14. As shown in FIG. 6, conventionally, wires 54 for wiring from IO units 12 installed on the rail 16 to cable ducts 14 extend from the front side of the IO units 12 to the cable ducts 14. In contrast, the wiring structure 10 according to the above-described embodiment is constructed such that, as shown in FIGS. 2 and 3, the IO unit 12 is electrically connected to the multiple wiring modules 20, and the lead wires 24a and 24b extend vertically (upward and downward) from the multiple wiring modules 20 to the cable ducts 14a and 14b. With this configuration, it is not necessary to connect a lead wire to the front side of the IO unit 12 supported by the rail 16, so that wires from the IO unit 12 to the cable ducts 14a and 14b can be shortened. Additionally, since the wires from the IO unit 12 will not cover the front side of the IO unit 12, heat can be suitably released, and the visibility of the display on the front side of the IO unit 12 can be increased. Further, maintenance of the IO unit 12 such as replacement can be easily carried out.

MODIFIED EXAMPLES

The above embodiment may be modified as follows.

Modified Example 1

One of the multiple wiring modules 20 provided in the wiring structure 10 may be a common wiring module 20c to which a common signal is supplied. The common signal is a signal used in common by multiple IO units 12. FIGS. 7A and 7B are diagrams showing a configuration of a common wiring module 20c according to a modified example 1. FIG. 7A is a front view of the common wiring module 20c according to a modified example 1 as viewed from the front side, and FIG. 7B is a right side view of the common wiring module 20c according to the modified example 1 as viewed from the right side.

The common signal is supplied to the common wiring module 20c from the lead wires 24a and 24b which are common lines connected to the common wiring module. The lead wire 24a is inserted into the housing 22 of the common wiring module 20c from the lower face 22a of the housing 22 of the common wiring module 20c, and is electrically connected to one end of an interconnection 60 in the housing 22 of the common wiring module 20c. The lead wire 24b is inserted into the housing 22 of the common wiring module 20c from the upper face 22b of the housing 22 of the common wiring module 20c, and is electrically connected to the other end of the interconnection 60 in the housing 22 of the common wiring module 20c. As in the case of the method of electrically connecting the lead wire 24a and the interconnection 30a, the method of electrically connecting the lead wire 24a or the lead wire 24b with the interconnection 60 is not limited.

The common wiring module 20c has, formed on the left side face 22e, power terminals 46a and 46b, which are electrically connected to the power terminals 36a, 36b or power terminals 48a and 48b, of one adjacent wiring module 20 (not shown in FIGS. 7A and 7B) on the left side. The right side face 22d of the common wiring module 20c is provided with power terminals 48a and 48b that are electrically connected to the power terminals 46a and 46b of the other adjacent wiring module 20 (not shown in FIGS. 7A and 7B) on the right side, and is further provided with a common terminal 62 that is electrically connected to the common terminal of the other adjacent wiring module 20 on the right side. Herein, the common terminal 62 is described as being provided on the right side face 22d of the common wiring module 20c, but may be provided on the left side face 22e. The following description similarly applies to both cases of the right side face and the left side face.

The common terminal 62 is connected to an interconnection 64 branched from the middle of the interconnection 60. Therefore, the common wiring module 20c can supply the common signal supplied from the lead wires 24a and 24b connected thereto to the adjacent wiring module 20 on the right side via the common terminal 62.

The common wiring module 20c has, arranged in the housing 22, a first power line 50a that connects the power terminal 46a and the power terminal 48a and a second power line 50b that connects the power terminal 46b and the power terminal 48b. The power line 50 including the first power line 50a and the second power line 50b supplies power supply voltage supplied from one adjacent wiring module 20, to the other adjacent wiring module 20.

When the multiple wiring modules 20 include the common wiring module 20c, the common signal is supplied to the IO unit 12 via the signal wiring module 20b. The configuration of the signal wiring module 20b in this case will be described. FIGS. 8A and 8B are diagrams showing a configuration of a signal wiring module 20b according to the modified example 1. FIG. 8A is a front view of the signal wiring module 20b according to the modified example 1 as viewed from the front side, and FIG. 8B is a right side view of the signal wiring module 20b according to the modified example 1 as viewed from the right side.

The signal wiring module 20b according to the modified example 1 in FIGS. 8A and 8B further includes components in addition to those included in the signal wiring module 20b of FIGS. 5A and 5B. Hereinafter, the components added to the signal wiring module 20b of FIGS. 5A and 5B will be described.

As shown in FIGS. 8A and 8B, the signal wiring module 20b has, provided on the front face 22c, a common terminal 70 that can be electrically connected to the IO unit 12. On the left side face 22e of the signal wiring module 20b, a common terminal 72 that is electrically connected to the common terminal 62 or 74 of one adjacent wiring module 20 on the left side (not shown in FIGS. 8A and 8B), is arranged.

A common terminal 74 that is electrically connected to the common terminal 72 of the other adjacent wiring module 20 (not shown in FIGS. 8A and 8B) on the right side is provided on the right side face 22d of the signal wiring module 20b. A common signal line 76 that connects the common terminal 72 and the common terminal 74 is provided in the housing 22 of the signal wiring module 20b. Thereby, the common signal line 76 delivers the common signal supplied from one adjacent wiring module 20 to the other adjacent wiring module 20. Further, a common supply line 78 branched from the middle of the common signal line 76 is connected to the common terminal 70. The common supply line 78 delivers the common signal supplied from one adjacent wiring module 20 to the IO unit 12 via the common terminal 70. Thereby, even in a case using common signals, it is possible to improve the front visibility of the IO unit 12 supported by the rail 16 and achieve easy maintenance of the IO unit 12.

Modified Example 2

Though in the above embodiment the cable ducts 14 (14a, 14b) are provided on both the upper and lower sides of the rail 16, there are cases where the cable duct exists on one side only. FIG. 9 is a perspective view showing a case where a cable duct 14 is provided on only the lower side of the rail 16. As shown in FIG. 9, when the cable duct 14a is provided on only the lower side of the rail 16, lead wires 24b extending from the upper faces 22b of the wiring modules 20 are routed to the cable duct 14a by avoiding the front face 22c of the wiring modules 20. In this case, the lead wires 24b become long.

Figure 10:
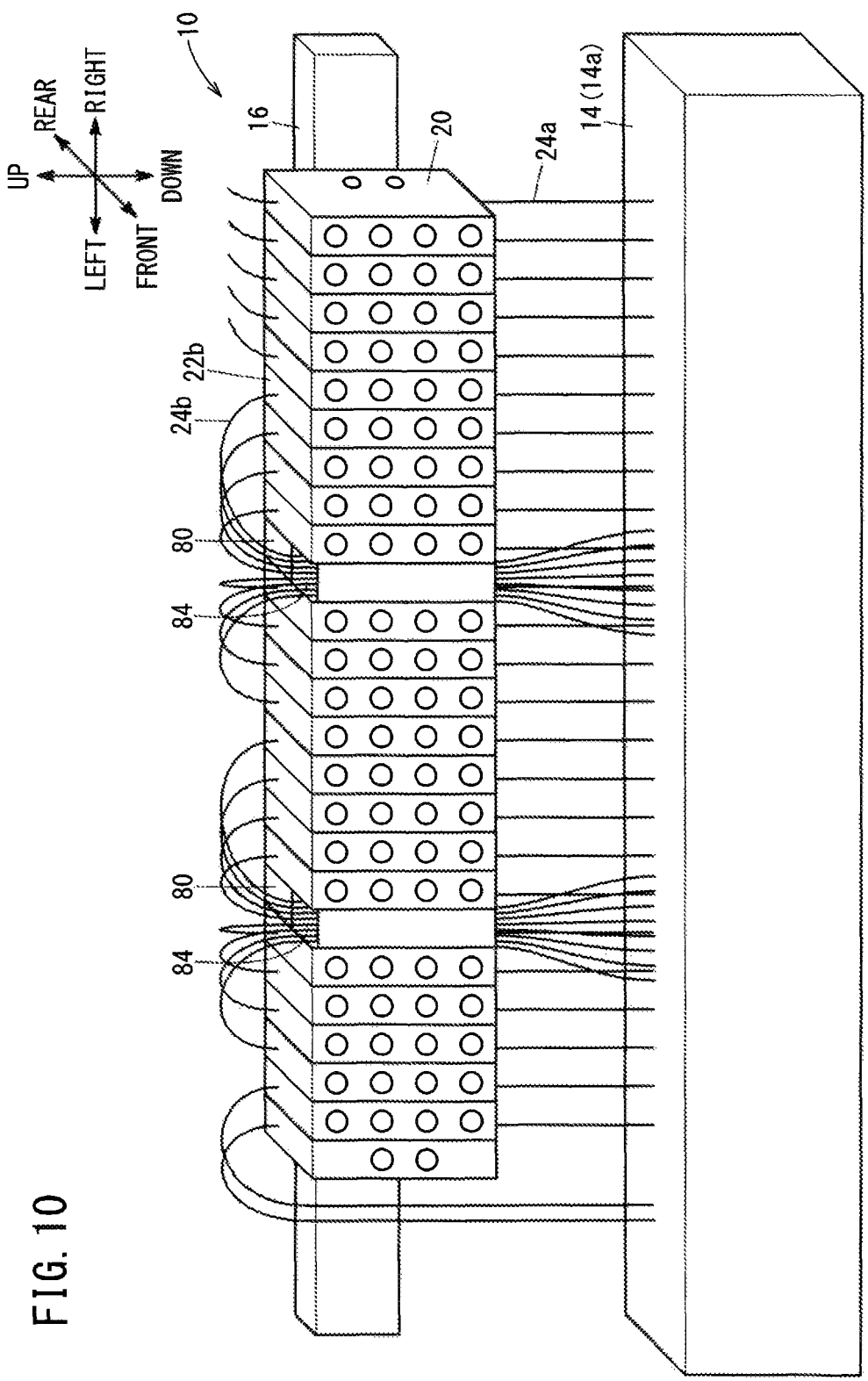
FIG. 10 is a perspective view illustrating a state in which an IO unit is removed from a wiring structure according to a modified example 2.

To deal with the above situation, in a wiring structure 10 of a modified example 2, wire through modules 80 are arranged adjacent to multiple wiring modules 20 so as to be located between wiring modules 20. FIG. 10 is a perspective view illustrating a state in which IO units 12 are removed from the wiring structure 10 of the modified example 2. The wire through modules 80 are set on the rail 16 from the front side of the rail 16 so as to be located adjacent to and between wiring modules 20.

Figure 11:
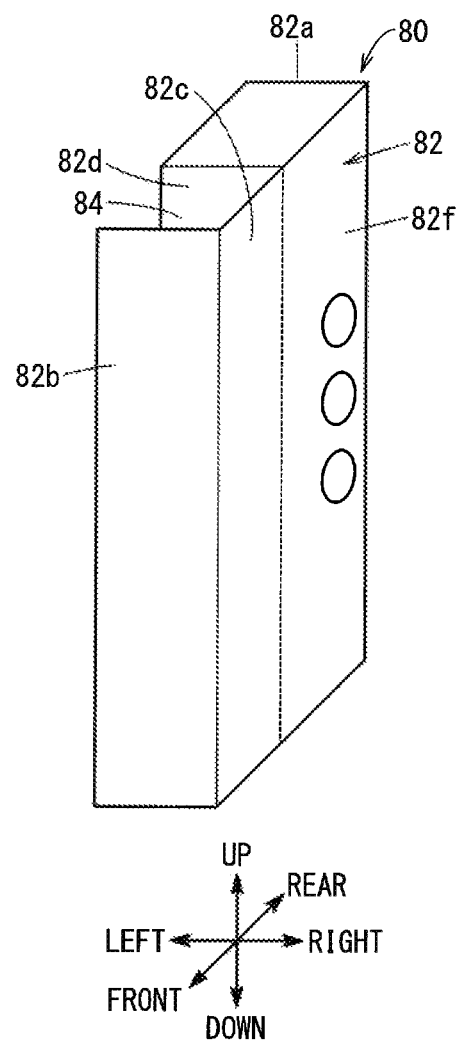
FIG. 11 is a perspective view showing a wire through module according to the modified example 2.
Figure 12A:
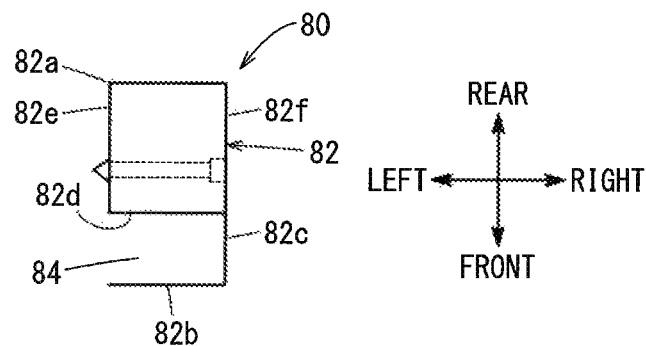
FIG. 12A is a top view of the wire through module according to the modified example 2.
Figure 12B:
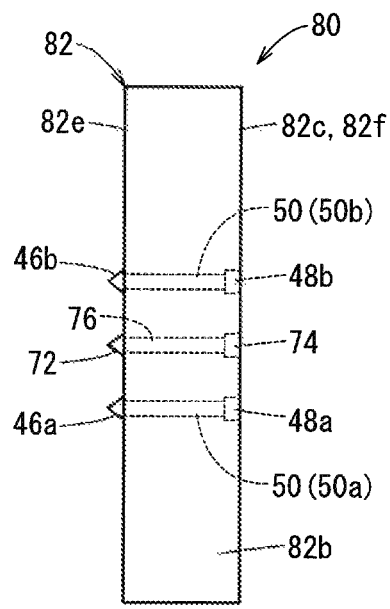
FIG. 12B is a front view thereof.
Figure 12C:
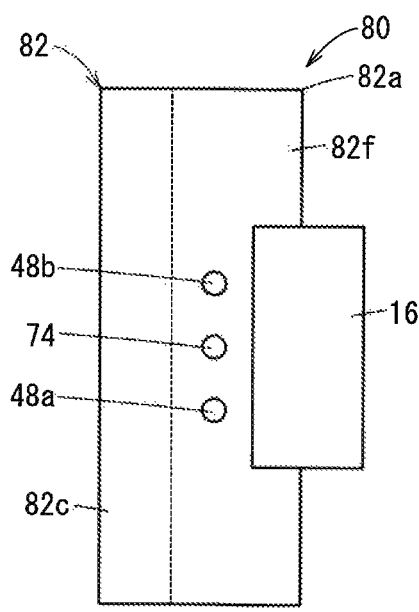
FIG. 12C is a right side view thereof.

FIG. 11 is a perspective view showing the wire through module 80 of the modified example 2. FIGS. 12A to 12C are diagrams showing a configuration of the wire through module 80 according to the modified example 2. FIG. 12A is a top view of the wire through module 80 of the modified example 2 as viewed from above, and FIG. 12B is a front view of the wire through module 80 of the modified example 2 as viewed from the front. FIG. 12C is a right view of the wire through module 80 of the modified example 2 as viewed from the right side. The housing, designated at 82, of the wire through module 80 has a main part 82a, a front wall 82b, and a side wall 82c. The front face, designated at 82d, of the main part 82a, and the front wall 82b are suitably spaced from each other, and the front face 82d, the front wall 82b and the side wall 82c define a through space 84 for the lead wires 24b. That is, the wire through module 80 is provided with the through space 84 through which the lead wires 24b can pass through vertically. The through space 84 is not limited to the above configuration as long as the lead wires 24b can pass therethrough even when the wiring modules 20 are arranged adjacent to the left and right sides of the wire through module 80.

The wire through module 80 has, formed on the left side face 82e of the main part 82a, power terminals 46a, 46b and a common terminal 72, which are electrically connected to the power terminals 36a, 36b, or the power terminals 48a, 48b and the common terminal 62 or 74, of one adjacent wiring module 20 (not shown in FIGS. 12A to 12C) on the left side. The right side face 82f of the main part 82a of the wire through module 80 is provided with power terminals 48a and 48b and common terminal 74, which are electrically connected to the power terminals 46a and 46b and the common terminal 72 of the other adjacent wiring module 20 (not shown in FIGS. 12A to 12C) on the right side. Further, a first power line 50a for connecting the power terminal 46a and the power terminal 48a and a second power line 50b for connecting the power terminal 46b and the power terminal 48b, are formed between the left and right side faces 82e and 82f of the main part 82a of the wire through module 80. The power line, designated at 50, of the first power line 50a and the second power line 50b, can deliver power supply voltage from one adjacent wiring module 20, to the other adjacent wiring module 20. Further, a common signal line 76 connecting the common terminal 72 and the common terminal 74 is provided between the left side face 82e and the right side face 82f of the main part 82a of the wire through module 80. The common signal line 76 delivers the common signal from one adjacent wiring module 20 to the other adjacent wiring module 20. It should be noted that the wire through module 80 does not necessarily have to have the common terminals 72 and 74 and the common signal line 76.

Provision of the wire through module 80 in the wiring structure 10 enables the lead wires 24b extending upward from the upper faces 22b of the housings 22 of the wiring modules 20 to pass through the through space 84 of the wire through module 80 and extend to the cable duct 14a as shown in FIG. 10. With the configuration, it is possible shorten the lead wires 24b. That is, according to the wiring structure 10 of the modified example 2, wires extending from a side across the rail 16 from the location side of the cable duct 14 in a direction away from the cable duct is guided and connected to the cable duct 14 while the wires can be shortened compared to those in the wiring structure 10 of the embodiment. Note that the lead wires 24a extending downward from the lower face 22a of the housings 22 of the wiring modules 20 may not exist. In this case, the upper face 22b may be regarded as the first face and the upper direction may be regarded as the third direction.

Modified Example 3

Figure 13:
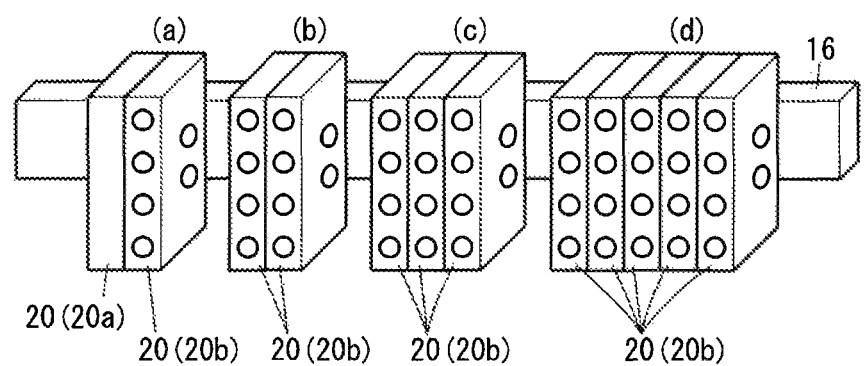
FIG. 13 is a perspective view showing a plurality of wiring modules according to a modified example 3.

The multiple wiring modules 20 included in the wiring structure 10 are not limited to those shown in FIG. 3. FIG. 13 is a perspective view showing a plurality of wiring modules 20 according to a modified example 3. The multiple wiring modules 20 may be one power supply wiring module 20a and one signal wiring module 20b adjacent to each other as shown in FIG. 13(a). Alternatively, the multiple wiring modules 20 may be two or more signal wiring modules 20b adjacent to each other as shown in FIG. 13(b), 13(c), or 13(d).

Modified Example 4

The above embodiment and the modified examples 1 to 3 may be arbitrarily combined as long as no technical inconsistency occurs.

Invention Obtained from the Embodiment

The invention that can be grasped from the above embodiment will be described below.
(First Invention)

The wiring structure (10) includes: a plurality of wiring modules (20) configured to be installed on a rail (16) that extends in a predetermined first direction, so as to be adjacent to one another along the rail (16), by being placed on the rail from the side of a second direction orthogonal to the first direction; an IO unit (input-output unit) (12) configured to be attached to the plurality of wiring modules (20) from the second direction side to thereby be electrically connected to the plurality of wiring modules (20). In each of the plurality of wiring modules (20), a lead wire (24a)

extending in a third direction that intersects the first direction and the second direction, from a first face (22a) of the wiring module that lies on the third direction side, is connected to the wiring module (20).

This structure eliminates the need to connect the lead wires (24a) to the front face of the IO unit (12) supported by the rail (16). Thus, it is possible to enhance the visibility of the front side of the IO unit (12) and achieve easy maintenance of the IO unit (12).

The plurality of wiring modules (20) may include at least one power supply wiring module (20a) configured to supply power supply voltage to the IO unit (12). The power supply wiring module (20a) may include a supply line (34) configured to deliver power supply voltage supplied from the lead wire (24a, 24b) connected to the power supply wiring module, to the IO unit (12), and a power line (38) configured to deliver the power supply voltage to an adjacent wiring module (20).

The plurality of wiring modules (20) may include at least one signal wiring module (20b) configured to transfer a signal that is input to and output from the IO unit (12). The signal wiring module (20b) may include an input and output line (44a, 44b) connecting the IO unit (12) and the lead wire (24a, 24b) connected to the signal wiring module, a supply line (52) configured to deliver power supply voltage supplied from one of the adjacent wiring modules (20), to the IO unit (12), and a power line (50) configured to deliver the power supply voltage to the other adjacent wiring module (20).

The signal wiring module (20b) may include a common supply line (78) configured to deliver a common signal supplied from one of the adjacent wiring modules (20), to the IO unit (12), and a common signal line (76) configured to deliver the common signal to the other adjacent wiring module (20). With the configuration, even when a common signal is used, it is possible to enhance the visibility of the front side of the IO unit (12) supported by the rail (16) and facilitate maintenance of the IO unit (12).

One of the wiring modules (20) may be a common wiring module (20c) configured to deliver the common signal supplied from the lead wire (24a, 24b) connected to the common wiring module, to the adjacent wiring modules (20).

A lead wire (24b) extending in the direction opposite to the third direction, from a second face (22b) of the wiring module that lies on a side opposite to the third direction side may be connected to the wiring module (20). A pair of cable ducts (14a, 14b) extending in the first direction may be arranged so that one cable duct is on the third direction side with respect to the rail (16) and the other cable duct is on the side opposite to the third direction side with respect to the rail (16). The lead wire (24a) extending from the first face (22a) may be configured to reach at least the one cable duct (14a) provided on the third direction side with respect to the rail (16), and the lead wire (24b) extending from the second face (22b) may be configured to reach at least the other cable duct (14b) provided on the side opposite to the third direction side with respect to the rail (16).

A lead wire (24b) extending in the direction opposite to the third direction, from a second face (22b) of the wiring module that lies on a side opposite to the third direction side may be connected to the wiring module (20). A cable duct (14a) extending in the first direction may be arranged on the third direction side with respect to the rail (16). A wire through module (80) may be further provided, the wire through module being arranged on the rail (16) so as to be adjacent to the wiring modules (20) by being placed on the rail from the second direction side, the wire through module having a power line (50) configured to deliver power supply voltage supplied from one of the adjacent wiring modules (20), to the other adjacent wiring module (20) and a through space (84) configured to allow the lead wire (24b) to pass therethrough. The lead wire (24a) extending from the first face (22a) may be configured to reach at least the cable duct (14a), and the lead wire (24b) extending from the second face (22b) may be configured to pass through the through space (84) and reach the cable duct (14a). With the configuration, the wires extending from a side of the module that lies across the rail (16) from the location of the cable duct (14) can be guided and connected to the cable duct (14) while the wires can be shortened.

A cable duct (14b) extending in the first direction may be arranged on the side opposite to the third direction side with respect to the rail (16). A wire through module (80) may be further provided, the wire through module being arranged on the rail (16) so as to be adjacent to the wiring modules (20) by being placed on the rail from the second direction side, the wire through module having a power line (50) configured to deliver power supply voltage supplied from one of the adjacent wiring modules (20), to the other adjacent wiring module (20), and a through space (84) configured to allow the lead wire (24a) to pass therethrough. The lead wire (24a) extending from the first face (22a) may be configured to pass through the through space (84) and reach the cable duct (14b). With this configuration, the wires extending from a side of the module that lies across the rail (16) from the location of the cable duct (14) can be guided and connected to the cable duct (14) while the wires can be shortened.

The present invention is not particularly limited to the embodiment described above, and various modifications are possible without departing from the essence and gist of the present invention.

What is claimed is:

1. A wiring structure comprising:
a plurality of wiring modules configured to be installed on a rail that extends in a predetermined first direction, the wiring modules adjacent to one another along the rail, by being placed on the rail from a second direction, the second direction orthogonal to the predetermined first direction, wherein each of the plurality of wiring modules includes, connected thereto a first lead wire extending in a third direction that intersects the predetermined first direction and the second direction, the first lead wire extending from a first face of a respective one of the wiring modules that faces the third direction;
an input-output unit configured to be attached to the plurality of wiring modules from the second direction to thereby be electrically connected to the plurality of wiring modules,
a first cable duct extending in the predetermined first direction is arranged on a side opposite to a side of the third direction with respect to the rail; and
a wire through module is further provided, the wire through module being arranged on the rail so as to be adjacent to the wiring modules by being placed on the rail from the second direction, the wire through module having a through module power line configured to deliver a power supply voltage supplied from an adjacent one of the wiring modules, to another adjacent one of the wiring modules, and a through space configured to allow the first lead wire to pass through the through space,
wherein the first lead wire is configured to pass through the through space and reach to the first cable duct.

2. The wiring structure according to claim 1, wherein:
the plurality of wiring modules includes at least one power supply wiring module (PSWM) configured to supply the power supply voltage to the input-output unit; and
the at least one PSWM includes a PSWM supply line configured to deliver the power supply voltage supplied from the first lead wire of the at least one PSWM, to the input-output unit, and a PSWM power line configured to deliver the power supply voltage to the adjacent one of the wiring modules.

3. The wiring structure according to claim 1, wherein:
the plurality of wiring modules includes at least one signal wiring module (SWM) configured to transfer a signal that is inputted to and outputted from the input-output unit; and
the at least one SWM includes:
an input/output line connecting the input-output unit and the first lead wire of the at least one SWM,
a SWM supply line configured to deliver the power supply voltage supplied from the adjacent one of the wiring modules, to the input-output unit, and
a SWM power line configured to deliver the power supply voltage to the another adjacent one of the wiring modules.

4. The wiring structure according to claim 3, wherein the at least one SWM further includes a common supply line configured to deliver a common signal supplied from one of the adjacent one of the wiring modules or the another adjacent one of the wiring modules, to the input-output unit, and a common signal line configured to deliver the common signal to another of the adjacent one of the wiring modules or the another adjacent one of the wiring modules.

5. The wiring structure according to claim 4, wherein:
each of the plurality of wiring modules further includes, connected thereto, a second lead wire extending in a direction opposite to the third direction, the second lead wire extends from a second face of each of the wiring modules that faces opposite to the third direction; and
one of the wiring modules is a common wiring module configured to deliver the common signal supplied from the first lead wire or the second lead wire of the common wiring module, to at least one of the adjacent one of the wiring modules or the another adjacent one of the wiring modules.

6. The wiring structure according to claim 1, wherein:
each of the plurality of wiring modules further includes, connected thereto, a second lead wire extending in a direction opposite to the third direction, the second lead wire extends from a second face of the respective one of the wiring modules that faces opposite to the third direction;
a second cable duct extending in the predetermined first direction is arranged so that the second cable duct is on the side of the third direction with respect to the rail; and
the first lead wire is further configured to reach at least to the second cable duct.

7. A wiring structure comprising:
a plurality of wiring modules configured to be installed on a rail that extends in a predetermined first direction, the wiring modules adjacent to one another along the rail, by being placed on the rail from a second direction, the second direction orthogonal to the predetermined first direction, wherein each of the plurality of wiring modules includes, connected thereto:
a first lead wire extending in a third direction that intersects the predetermined first direction and the second direction, the first lead wire extending from a first face of a respective one of the wiring modules that faces the third direction, and
a second lead wire extending in a direction opposite to the third direction, the second lead wire extends from a second face of the respective one of the wiring modules that faces opposite to the third direction;
an input-output unit configured to be attached to the plurality of wiring modules from the second direction to thereby be electrically connected to the plurality of wiring modules;
a first cable duct extending in the predetermined first direction is arranged on a side of the third direction with respect to the rail, the first lead wire is configured to reach to at least the first cable duct; and
a wire through module (WTM) is further provided, the WTM being arranged on the rail so as to be adjacent to the wiring modules by being placed on the rail from the second direction, the WTM having a WTM power line configured to deliver a power supply voltage supplied from an adjacent one of the wiring modules, to another adjacent one of the wiring modules, and a through space configured to allow the second lead wire to pass through the through space and reach to the first cable duct.

8. The wiring structure according to claim 7, wherein:
the plurality of wiring modules include at least one power supply wiring module (PSWM) configured to supply the power supply voltage to the input-output unit; and
the at least one PSWM includes a PSWM supply line configured to deliver the power supply voltage supplied from the first lead wire of the at least one PSWM, to the input-output unit, and a PSWM power line configured to deliver the power supply voltage to the adjacent one of the wiring modules.

9. The wiring structure according to claim 7, wherein:
the plurality of wiring modules includes at least one signal wiring module (SWM) configured to transfer a signal that is inputted to and outputted from the input-output unit; and
the at least one SWM includes:
an input/output line connecting the input-output unit and the first lead wire of the at least one SWM,
a SWM supply line configured to deliver the power supply voltage supplied from the adjacent one of the wiring modules, to the input-output unit, and
a SWM power line configured to deliver the power supply voltage to the another adjacent one of the wiring modules.

10. The wiring structure according to claim 9, wherein the at least one SWM further includes a common supply line configured to deliver a common signal supplied from one of the adjacent one of the wiring modules or the another adjacent one of the wiring modules, to the input-output unit, and a second common signal line configured to deliver the common signal to another of the adjacent one of the wiring modules or the another adjacent one of the wiring modules.

11. The wiring structure according to claim 10, wherein one of the wiring modules is a common wiring module configured to deliver the common signal supplied from the first lead wire or the second lead wire of the common wiring module, to at least one of the adjacent one of the wiring modules or the another adjacent one of the wiring modules.

12. The wiring structure according to claim 7, wherein:
a second cable duct extending in the predetermined first direction is arranged so that the second cable duct is on a side opposite to the side of the third direction with respect to the rail; and
the second lead wire is further configured to reach at least to the second cable duct.

\* \* \* \* \*